United States Patent [19]

Schwerdt

[11] 4,228,423
[45] Oct. 14, 1980

[54] OFFSET CORRECTION APPARATUS FOR A SUCCESSIVE APPROXIMATION A/D CONVERTER

[75] Inventor: Christopher B. Schwerdt, Catonsville, Md.

[73] Assignee: The United States of America as represented by the Secretary of the Air Force, Washington, D.C.

[21] Appl. No.: 866,143

[22] Filed: Dec. 30, 1977

[51] Int. Cl.² ............................................. H03K 13/02
[52] U.S. Cl. ......................... 340/347 CC; 340/347 AD; 340/347 M
[58] Field of Search ................. 340/347 CC, 347 SH, 340/347 AD, 347 M; 330/9; 328/162, 165

[56] References Cited

U.S. PATENT DOCUMENTS

| 3,430,225 | 2/1969 | Avignon | 340/347 CC |
|---|---|---|---|
| 3,685,048 | 8/1972 | Pincus | 340/347 CC |
| 3,754,232 | 8/1973 | Gut et al. | 340/347 CC |
| 3,824,481 | 7/1974 | Sponholz et al. | 328/162 |
| 3,982,241 | 9/1976 | Lipcon | 340/347 M X |

OTHER PUBLICATIONS

Boindiris, Automatic Zero Correction Technique, IBM Technical Disclosure Bulletin, vol. 18, No. 1, 6/1975, pp. 11–13.
The Engineering Staff of Analog Devices, Inc., Analog-Ditital Conversion Handbook, 6/1972, pp. II-80 & 81.
Schmid, Electronic Analog/Digital Conversions, Van Nostrand Reinhold Co., 1970, pp. 387–392.

Primary Examiner—Thomas J. Slotan
Attorney, Agent, or Firm—Joseph E. Rusz; William Stepanishen

[57] ABSTRACT

An offset correction apparatus for a successive approximation analog to digital converter which will correct the A/D converter-derived offset voltage as referred to the analog input to within ±1mV of a preset reference over a wide temperature range.

6 Claims, 3 Drawing Figures

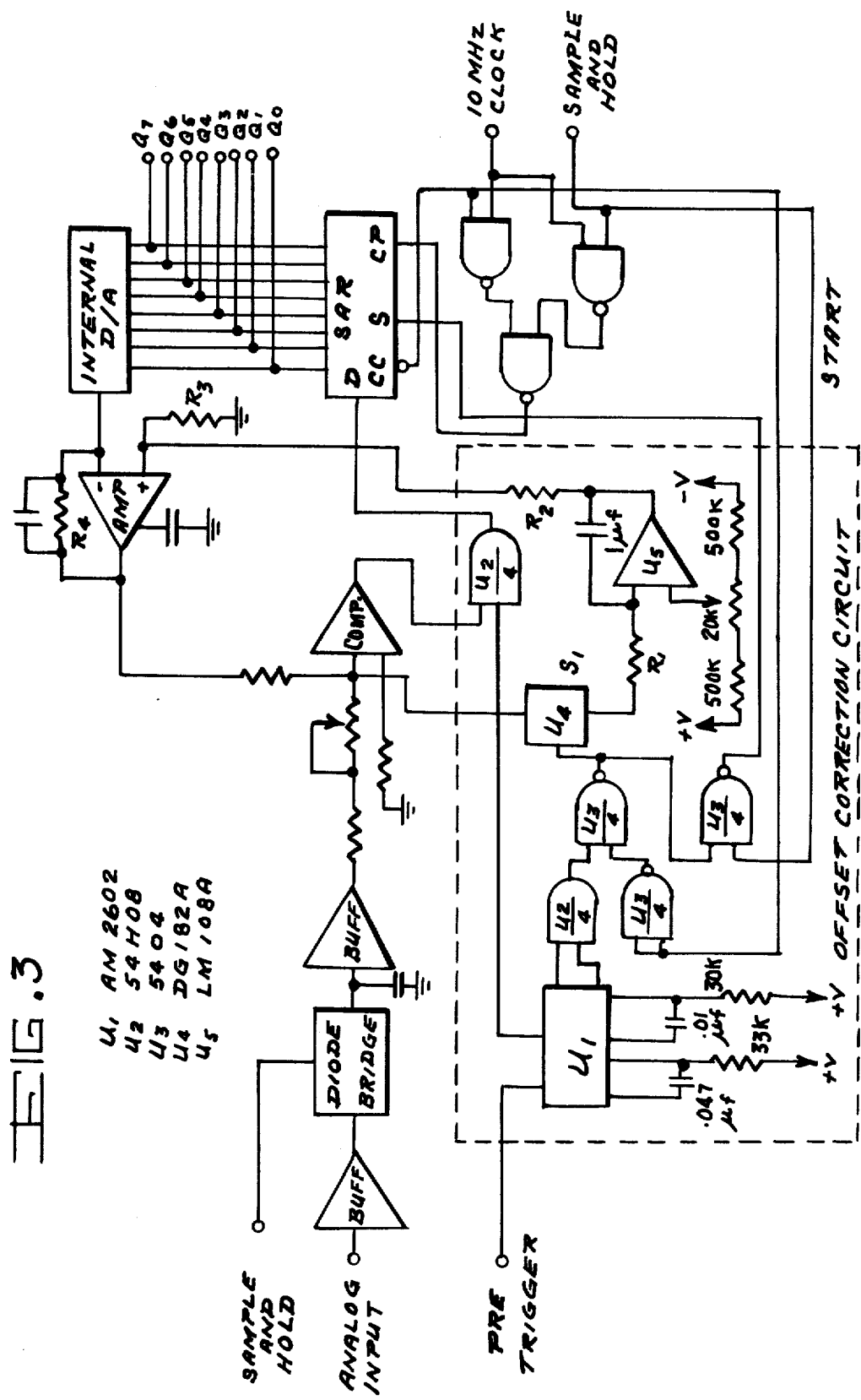

OFFSET CORRECTION APPARATUS FOR A SUCCESSIVE APPROXIMATION A/D CONVERTER

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an A/D converter correction apparatus, and in particular, to an offset correction apparatus for a successive approximation A/D converter.

In the prior art, the offset correction loop has been employed to maintain a constant, preset offset voltage that is referred to the input of the successive approximation analog to digital convertor apparatus. A half least significant bit (LSB) offset voltage is normally required (referred to the analog input of the A/D) to reduce quantizing errors at low level analog inputs. The offset correction circuit will correct for any low frequency, temperature related offsets internally generated in the successive approximation A/D converter apparatus. However, it will also correct for any low frequency offsets present at the analog input of the successive approximation A/D converter. The time constant of the correction loop is chosen to be long compared to the frequency of the analog signal being converted. This insures stable closed loop operation of the correction loop.

The conventional prior art offset correction circuit for successive approximation A/D converters rely on field effect transistor (FET) switches to break the closed loop operation of the A/D converter and sum in a correction voltage ($V_c$) proportional to offsets either at the analog input or in the elements in the successive approximation A/D converter. The switching transients in the field effect transistor switches vary with temperature. These transients and the stray capacitance associated with the switches introduce an output offset voltage related to the duty cycle of the offset correction loop. In addition, any output offset voltage variation in the internal converter will not be corrected, since the FET switches will switch the internal D/A converter out of the loop during offset correction. In the prior art, the best offset correction that could be achieved over a 0° C. to 70° C. temperature range, is about ±10 mv DC when using the aforementioned conventional offset correction loop and standard A/D components. For an A/D converter whose least significant bit is less than 40 mV, a ±10 mV variation over temperature is not acceptable.

SUMMARY

The present invention utilizes an offset correction circuit in a successive approximation A/D converter in which the internal D/A of the converter is incorporated into the offset correction loop. A timing circuit is used to provide a signal reaction loop. A timing circuit is used to provide a signal indicative of when the correction loop should be closed. When this signal occurs a digital zero is fed into a successive approximation register (SAR) and all bits out of the SAR remain at digital zero for the duration of the offset correction period. Thus, any non-zero voltage appearing at the output of the internal D/A of the converter will comprise an offset voltage which the offset correction circuit can correct.

It is one object of the present invention, therefore, to provide an improved offset correction apparatus utilizing the internal digital to analog conversion with the offset correction loop.

It is another object of the invention to provide an improved offset correction apparatus utilizing the timing signal associated with a digital to analog conversion to operate the correction circuitry.

It is still another object of the invention to provide an improved offset correction apparatus which will automatically compensate for a non-zero voltage at the output of the internal digital to analog converter.

These and other advantages, objects and features of the invention will become more apparent from the following description taken in conjunction with the illustrative embodiment in the accompanying drawings.

BRIEF DESCRIPTION OF THE DRAWINGS

FIG. 3 is a block diagram of a test configuration of the offset correction apparatus to test offset correction operation.

DESCRIPTION OF THE PREFERRED EMBODIMENT

Figure 1:
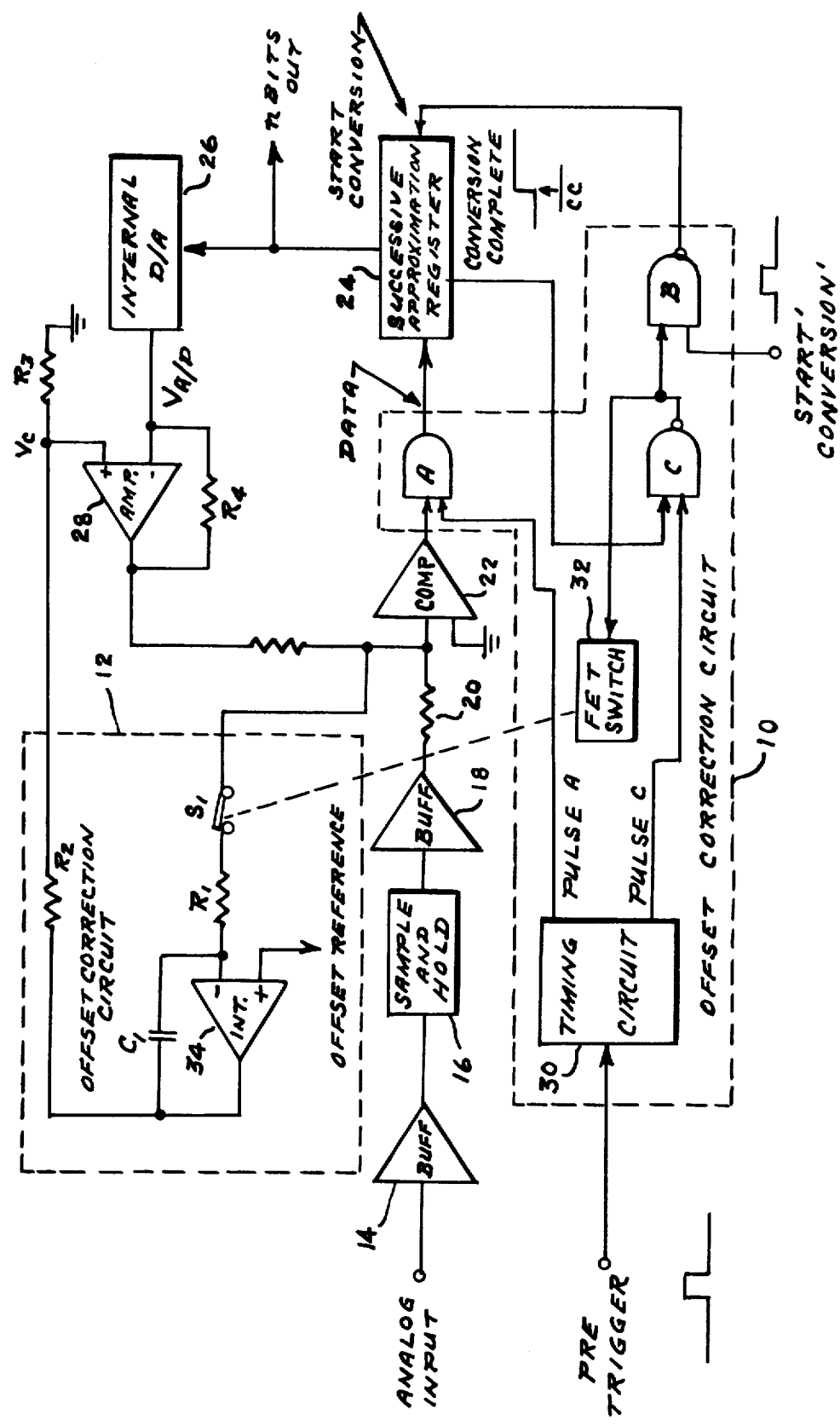
FIG. 1 is a block diagram of the offset correction apparatus in accordance with the present invention.

Referring now to FIG. 1, there is shown an offset correction apparatus being utilized in a successive approximation A/D converter circuit to provide a correction for any offset voltage that exists or is generated within the converter circuit. The offset correction apparatus is shown in FIG. 1 as comprising an offset correction control circuit 10 and an offset correction voltage generating unit 12. The remaining circuitry from the analog input through to the digital output comprises the successive approximation A/D converter circuit. The converter circuit is comprised of a buffer 14 which receives the input analog signal and is connected to a sample and hold unit 16. The sample and hold unit 16 is connected through a second buffer 18 and a resistor 20 to a comparator unit 22. The output of the comparator unit 22 is applied through logic gate A which is part of the offset correction control circuit 10 to the successive approximation register 24. The internal D/A converter 26 and the amplifier 28 form a loop from the successive approximation register 24 to the comparator 22. The offset correction control circuit 10 comprises a timing unit 30 which receives a pre-trigger pulse and provides a pulse A and C to gates A and C respectively. Gate C which receives input data from the successive approximation register 24, provides an output signal to FET switch 32 and gate B. Gate B also receives a start conversion signal and in response to presence of both input signals, provides an output signal to the successive approximation register 24 to start the data conversion process. When the switch S1 in the offset correction voltage generating unit 12 is closed by FET switch 32, the integrating unit 34 is connected from the input of the comparator 22 to the positive input of the amplifier 28.

Figure 2:
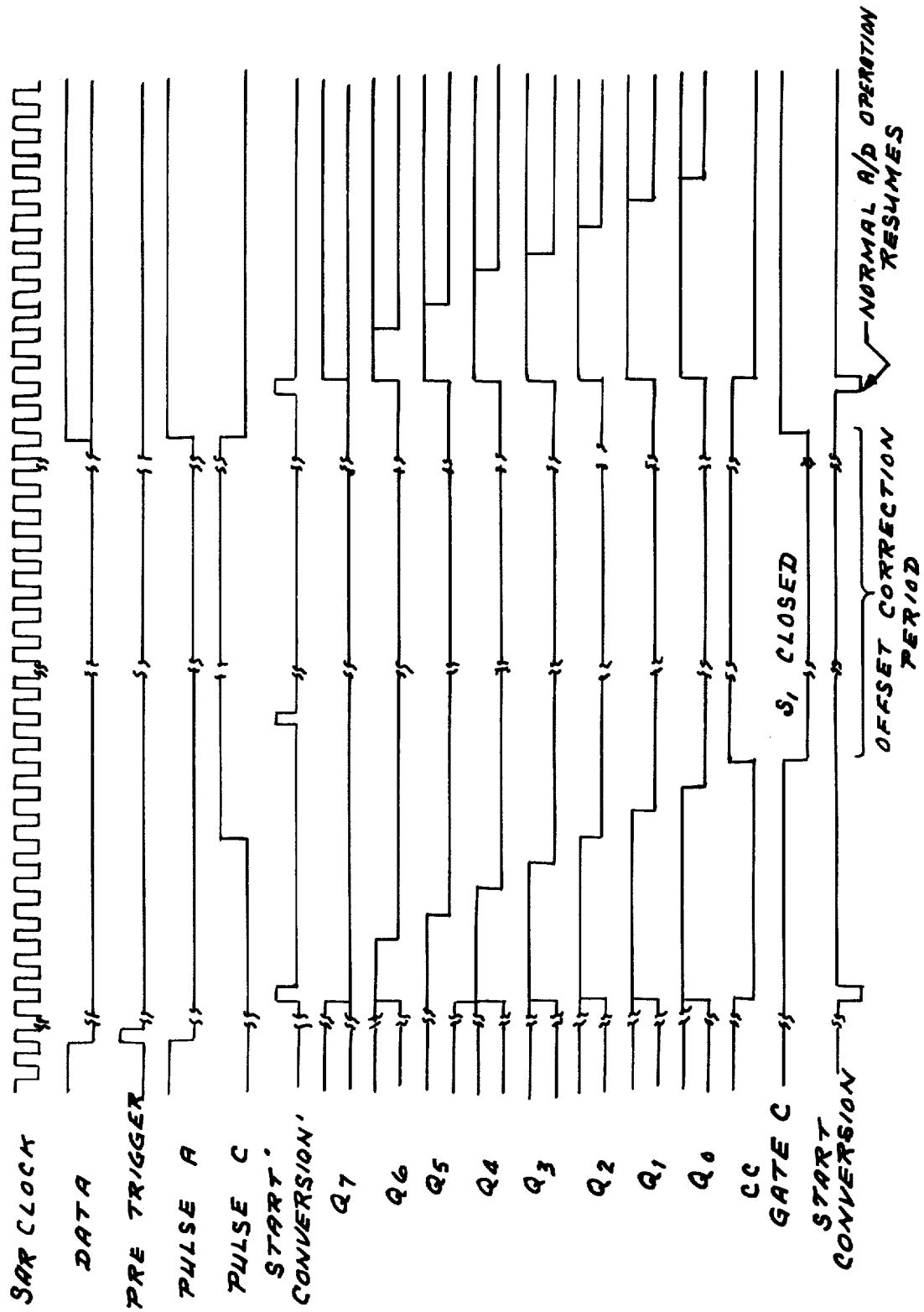
FIG. 2 is a signal timing diagram for the offset correction apparatus shown in FIG. 1.

The new offset correction loop operates in the following manner. A system timing signal pre-trigger that indicates when the correction loop should be closed is applied to the timing unit 30. When the pre-trigger signal occurs, a digital zero is continually forced into the DATA input of the successive approximation register 24 for the duration of the correction time. Thus, the first successive approximation after the pre-trigger signal will set all bits out of the successive approximation register 24 to a digital zero (i.e., 0 volts out of the internal D/A). At the first conversion complete flag after the pre-trigger signal the start conversion pulse will be gated off by gate B. Thus, all bits out of the successive approximation register 24 will remain at a digital zero for the duration of the offset correction period. Since all bits out of the successive approximation register 24 are zero, any non zero voltage ($V_{A/D}$) appearing at the internal D/A output will be an offset which will be corrected for by the loop. At the end of the offset correction period gate B will be enabled and normal operation of the successive approximation A/D will begin with the next start conversion pulse. There is shown in FIG. 2 the timing signals and their relationship to one another as they are used in the offset correction apparatus shown in FIG. 1 and FIG. 3.

Turning now to FIG. 3 there is shown the configuration of the offset correction apparatus that was utilized in the analysis of the operation of the offset correction apparatus. The successive approximation A/D Converter operates at a clock frequency of 10 MHz with a total conversion time of 1.2 micro seconds. The frequency of analog voltage being converted is approximately 400 KHz. The offset correction duty cycle is 5% with the offset voltage (referred to the analog input) for the converter set to +10 mVDC (¼ LSB) by the offset reference. Values for resistors R1, R1, R3, R4 & C1 were chosen to give the offset correction loop an effective time constant of 2.0 seconds.

SOURCES OF OFFSET ERROR OVER TEMPERATURE (0° C. TO 70° C.)

1. Integrator input offset voltage ±0.25 mV
2. Offset reference pot resistance variation ±0.06 mV
3. ±15 v regulation tolerance of ±1% ±0.05 mV
4. Comparator input offset voltage ±0.15 mV Total Calculated Offset Error ±0.51 mV The actual measured offset voltage (referred to the analog input) variation from a preset +10 mV (over a 0° C. to 70° C. temperature range) was shown to be less than ±1 mV. This type of offset correction loop may be utilized in a successive approximation A/D converter whose least significant bit is as small as 4.0 mV.

Although the invention has been described with reference to a particular embodiment, it will be understood to those skilled in the art that the invention is capable of a variety of alternative embodiments within the spirit and scope of the appended claims.

What is claimed is:

1. A successive approximation analog-to-digital converter in combination with an offset correction generating means and offset correction control means wherein
    said converter includes a successive approximation register for providing a successive approximation digital signal upon receipt of an analog input signal, a digital-to-analog converter connected to the output of said successive approximation register, a comparator having an output for connection to the input of said register, a dual input amplifier connected between said digital-to-analog converter and an input to said comparator, said comparator also being connected to receive the input analog signal to be digitized by the analog-to-digital converter,
    said offset correction generating means being connected to receive an offset reference voltage and selectively connected to receive the output from said dual input amplifier to provide an offset correction output signal which is applied to the other input of said dual input amplifier, the output of which is an offset correction voltage; and
    said offset correction control means controls the selective connection of said offset correction generating means to said comparator, said correction control means including a logic gate connected between said comparator and said successive approximation register, said logic gate being operable upon receipt of a pretrigger signal to interrupt the normal analog-to-digital conversion and force said successive approximation register to have a predetermined state imposed thereon such that the correction voltage output from said dual input amplifier may be applied to said successive approximation register through said logic gate.

2. An offset correction apparatus as described in claim 1 wherein said offset correction control means comprises in combination:
    a timing means to receive said pre-trigger signal, said timing means generating a first and second pulse in response to said pre-trigger signal,
    a switching means connected to said offset correction generating means, and
    logic means connected to said timing means to receive said first and second pulse therefrom, said logic means being connected to said successive approximation A/D converter, said logic means receiving a start conversion signal to initiate the conversion process, said logic means applying an enable signal to said switching means, said logic means receiving a conversion complete signal from said successive approximation A/D converter.

3. An offset correction apparatus as described in claim 1 wherein said offset correction generating means comprising in combination:
    a switch means connected to and activated by said offset correction control means, said switch means having a first and second contact, said first contact being connected to the input of said successive approximation A/D converter, and,
    an integrating means having a positive and negative input, said positive input being connected to an offset reference voltage, said negative input being connected to said second contact of said switch means, said integrating means being connected to cause application of an offset correction voltage to said successive approximation A/D converter.

4. An offset correction apparatus as described in claim 1 wherein said predetermined state equals all binary zeros.

5. The combination as defined in claim 1 wherein said offset correction generating means includes an integrating unit connected with said offset reference signal and selectively connected with the output from said dual input amplifier, the selective connection with the output from said dual input amplifier comprising switch means operated by said offset correction control means.

6. The combination as defined in claim 5 wherein said offset correction control means includes a timing means to receive said pretrigger signal and generate first and second pulses in response thereto, said logic gate being connected for operation by one of said pulses of said timing means, a second gate operable by the other pulse of said timing means to control said switch for said selective connection, and a third gate connected with said second gate and said successive approximation register such that upon receipt of simultaneous signals from said second gate and register the data conversion process is initiated.

* * * * *